(12) United States Patent
Razeeb et al.

(10) Patent No.: US 8,703,271 B2
(45) Date of Patent: Apr. 22, 2014

(54) THERMAL INTERFACE MATERIAL

(75) Inventors: Kafil M. Razeeb, Shanakiel (IE); Saibal Roy, Carrigaline (IE); James Francis Rohan, Frankfield (IE); Lorraine Christine Nagle, Mallow (IE)

(73) Assignee: University College Cork—National University of Ireland, Cork County (IE)

( * ) Notice: Subject to any disclaimer, the term of this patent is extended or adjusted under 35 U.S.C. 154(b) by 819 days.

(21) Appl. No.: 12/597,145

(22) PCT Filed: Apr. 23, 2008

(86) PCT No.: PCT/IE2008/000047
§ 371 (c)(1),
(2), (4) Date: Apr. 19, 2010

(87) PCT Pub. No.: WO2008/129525
PCT Pub. Date: Oct. 30, 2008

(65) Prior Publication Data
US 2010/0196659 A1 Aug. 5, 2010

(30) Foreign Application Priority Data

Apr. 23, 2007 (IE) .................................. 2007/0298
Feb. 22, 2008 (IE) .................................. 2008/0135

(51) Int. Cl.
*H01L 23/34* (2006.01)
*H01L 23/373* (2006.01)
*B32B 3/24* (2006.01)
*C25D 5/02* (2006.01)
*C25D 15/00* (2006.01)

(52) U.S. Cl.
USPC ........... 428/138; 428/113; 428/119; 428/120; 428/137; 428/323; 428/332; 428/338; 428/364; 428/366; 428/367; 428/376; 428/379; 428/397; 428/401; 428/402; 165/185; 977/734; 977/742; 977/762; 977/772; 977/780; 977/782; 977/833; 257/E23.11; 257/E23.112; 205/109; 205/118; 205/122

(58) Field of Classification Search
None
See application file for complete search history.

(56) References Cited

U.S. PATENT DOCUMENTS 6,350,488 B1 * 2/2002 Lee et al. .................... 427/249.1
6,741,019 B1 * 5/2004 Filas et al. .................... 313/355

(Continued)

OTHER PUBLICATIONS

Meyyappan, Carbon Nanotubes: Science and Applications, Jul. 2004, p. 338.*

(Continued)

*Primary Examiner* — Aaron S Austin
*Assistant Examiner* — Jeff Vonch
(74) *Attorney, Agent, or Firm* — Brian J. Colandreo; Michael T. Abramson

(57) ABSTRACT

A thermal interface material (1) comprises a bulk polymer (2) within which is embedded sub-micron (c. 200 to 220 nm) composite material wires (3) having Ag and carbon nanotubes ("CNTs") 4. The CNTs are embedded in the axial direction and have diameters in the range of 9.5 to 10 nm and have a length of about 0.7 µm. In general the pore diameter can be in the range of 40 to 1200 nm. The material (1) has particularly good thermal conductivity because the wires (3) give excellent directionality to the nanotubes (4)—providing very low resistance heat transfer paths. The TIM is best suited for use between semiconductor devices (e.g. power semiconductor chip) and any type of thermal management systems for efficient removal of heat from the device.

13 Claims, 5 Drawing Sheets

(56) References Cited

U.S. PATENT DOCUMENTS

| | | | |
|---|---|---|---|
| 6,821,625 B2* | 11/2004 | Chu et al. | 428/408 |
| 7,148,512 B2* | 12/2006 | Leu et al. | 257/77 |
| 7,286,359 B2* | 10/2007 | Khbeis et al. | 361/704 |
| 7,291,396 B2* | 11/2007 | Huang et al. | 428/408 |
| 7,381,592 B2* | 6/2008 | Yoshimura | 438/122 |
| 7,678,614 B2* | 3/2010 | Huang et al. | 438/122 |
| 2003/0150604 A1 | 8/2003 | Koning | |
| 2003/0153667 A1 | 8/2003 | Jayaraman | |
| 2005/0116336 A1* | 6/2005 | Chopra et al. | 257/720 |
| 2005/0139642 A1* | 6/2005 | Koning et al. | 228/245 |
| 2006/0055933 A1* | 3/2006 | Mukai | 356/445 |
| 2006/0099438 A1* | 5/2006 | Arai et al. | 428/615 |
| 2006/0234056 A1* | 10/2006 | Huang et al. | 428/408 |
| 2006/0270116 A1* | 11/2006 | Dangelo | 438/122 |
| 2007/0119582 A1* | 5/2007 | Zhang et al. | 165/183 |

OTHER PUBLICATIONS

International Search Report with Written Opinion, dated Jul. 16, 2008, received in international patent application No. PCT/IE2008/000047, 2 pgs.

* cited by examiner

THERMAL INTERFACE MATERIAL

RELATED APPLICATIONS

The subject application is a U.S. National Stage application that claims the priority of International Application No. PCT/IE2008/000047, filed on 23 Apr. 2008, which claims the priority of Irish National Application Nos.: 2007/0298, filed on 23 Apr. 2007, and 2008/0135, filed on 22 Feb. 2008, the contents of which are herein incorporated by reference in their entirety.

FIELD OF THE INVENTION

The invention relates to a thermal interface material ("TIM") for uses such as high thermal conductivity.

One of the main limitations in power semiconductor device cooling is the microscopic unevenness and non-planarity between the mating surfaces (chip and heat sink). Asperities on each of the surfaces prevent the two solids forming a thermally perfect contact. Therefore there have been proposals to move away from TIMs in the form of bulk rigid bodies such as Cu films.

Thermal interface materials are therefore used to provide a reliable heat conduction path between two solid surfaces, which can conform to surface roughness. These are usually low cost conductive composites made of an insulating matrix (e.g. polymer) loaded with micron-sized conductive filler materials. An example is described in [Eric C. Samson et al. Vol. 9 (1), (2005), pp. 75-86], which describes commercial TIMs having a polymer bulk material within which are embedded micron-sized filler particles (e.g. Al, $Al_2O_3$, or BN). A high density of filler particles is required to achieve a percolation threshold so that heat can be transferred across the material from one surface to another surface. Percolation is a statistical concept that describes the formation of a cluster of connected particles or pathways occurs above a given concentration of those particles.

In such TIMs the thermal conductivity decreases very much (e.g. below 10 $Wm^{-1}K^{-1}$) due to the size effect and non-homogeneous shape of the embedded particles and the large interfacial resistance between the embedded particles within the TIM.

The invention is directed towards providing an improved TIM for applications where there is unevenness, generally where conformity and high thermal conductivity are required.

SUMMARY OF THE INVENTION

According to the invention, there is provided a thermal interface material comprising:
 a body having opposed faces, and
 aligned submicron wires in pores in the body and extending between the opposed faces,
 each submicron wire including a metal.

The aligned sub-micron wires give excellent heat transfer paths and the body may be chosen for the required degree of flexibility for conformity with the end-application devices with which it is in contact.

In one embodiment, the wires include nano-scale carbon particles aligned in the metal. This considerably adds to heat transfer capacity of the material.

The carbon particles may be carbon nanotubes, in one embodiment multi-wall nanotubes, or alternatively of a type selected from carbon nanohorns, fullerenes, or nanofibers.

In one embodiment, the carbon particles have a diameter in the range of 1 to 50 nm.

In one embodiment, the diameter is approximately 9.5 nm to 10 nm.

In one embodiment, the wires have a diameter in the range of 40 nm to 1200 nm, and preferably 200 to 220 nm.

The metal is preferably silver.

The wires may include nano-scale particles of boron nitride.

Preferably, the proportion by weight of wires to polymer body is in the range of 20% to 50%, the pore density of the body is in the range of $1\times10^8$ $cm^{-2}$ to $1\times10^{12}$ $cm^{-2}$, and preferably approximately $1\times10^9$ $cm^{-2}$.

The length of the wires is preferably in the range of 10 μm to 60 μm, and most preferably in the range of 20 μm to 35 μm.

In one embodiment, the aspect ratio of the wires is in the range of 50 to 300.

In one embodiment, the thickness of the material across the faces is in the range of 20 μm to 60 μm and in one embodiment is approximately 60 μm.

The body is preferably a polymer such as polycarbonate.

In another aspect, the invention provides a method of producing any thermal interface material defined above, wherein the metal is deposited in an electro-deposition process in the pores of the body to form the aligned sub-micron wires.

In one embodiment, the metal is co-deposited with dispersed carbon particles in a bath in the electro-deposition process in the pores of the body, so that the carbon particles are aligned and embedded in the metal.

The carbon particles are preferably carbon nanotubes.

The pores are preferably of generally cylindrical configuration.

In one embodiment, the template is of a polymer material such as polycarbonate.

In one embodiment, the method comprises the further step of depositing by evaporation a metallic layer on surfaces of the template to provide a cathode for electro-deposition.

In one embodiment, the carbon particles are dispersed in the bath by a polyacrylic acid surfactant.

DETAILED DESCRIPTION OF THE INVENTION

Brief Description of the Drawings

The invention will be more clearly understood from the following description of some embodiments thereof, given by way of example only with reference to the accompanying drawings in which.

DESCRIPTION OF THE EMBODIMENTS

Figure 1:
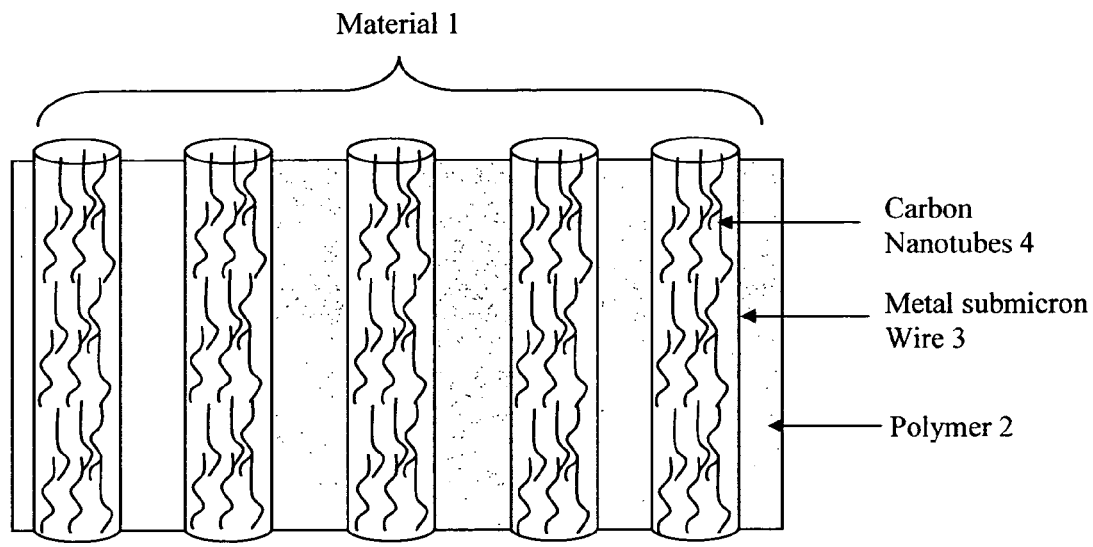
FIG. 1 is a diagram illustrating a thermal interface material of the invention.

Referring to FIG. 1 a thermal interface material 1 comprises a bulk polymer 2 within which is embedded sub-micron (c. 200 to 220 nm) composite material wires 3 having Ag and carbon nanotubes ("CNTs") 4. The CNTs are embedded in the axial direction and have diameters ranging from 1-50 nm, but the majority being in the range of 9.5 to 10 nm and have a length of about 0.7 µm. In general the pore diameter can be in the range of 40 to 1200 nm.

In general, the CNTs could include single wall carbon nanotubes (SWCNT), double wall carbon nanotubes (DWCNT), multiwall carbon nanotubes (MWCNT), boron nitride nanotubes (BNNT) and any other nanotubes having high thermal conductivity. Multiwall nanotubes are used in this embodiment, and are easy to electrodeposit and show high thermal conductivity (3000 $Wm^{-1}K^{-1}$). However, a mixture of single wall and multiwall carbon nanotube could alternatively be used to achieve even higher thermal conductivity as we understand that the thermal conductivity of SWCNTs can be approximately 6000 $Wm^{-1}K^{-1}$.

Examples of sub-micron wire metals include copper, nickel, gold or any other metal which has high thermal conductivity at room temperature, however silver is preferred.

Figure 2:
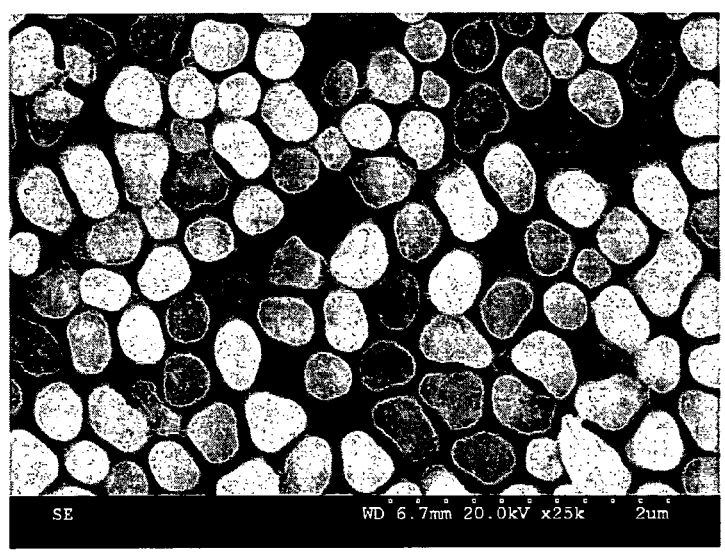
FIG. 2 is a scanning electron micrograph showing sub-micron wires of the material.

The material 1 has particularly good thermal conductivity because the wires 3 give excellent directionality to the nanotubes 4—providing very low resistance heat transfer paths. FIG. 2 shows the top surface of the sub-micron wires, at a magnification of 25,000.

The TIM is best suited for use between semiconductor devices (e.g. power semiconductor chip) and any type of thermal management systems for efficient removal of heat from the device. This material has the potential to achieve thermal conductivity beyond state of the art thermal interface material pads. In the near future, the power level for power semiconductor devices will rise to about 200 W, or about an effective power density of 500 $Win^{-2}$. In order to remove the heat efficiently, different types of thermal interface material (TIM) are used between packaged semiconductor device and the thermal management system e.g. heat sink. Present TIMs (having thermal conductivity of 10-50 $Wm^{-1}K^{-1}$) are not sufficient to remove the heat of these power semiconductors. The TIM the invention has a thermal conductivity of >80 $Wm^{-1}K^{-1}$ and thereby is able to dissipate the heat very efficiently.

The "MWCNT" (multiwall carbon nanotubes) and metal composites are embedded in polymer as high aspect ratio wires and thereby act as a thermal path between two mating surfaces, which can conform to the surface roughness due to their submicron diameters and micron lengths. Because the template within which they are embedded has some flexibility there is excellent conformity with the mating surfaces. As the metal co-deposited with carbon nanotubes have high thermal conductivity (3000 $Wm^{-1}K^{-1}$), the overall conductivity of the wires is increased. Unlike the prior art, it does not depend on the percolation threshold property of the filler materials of commercial TIM product to constitute a thermal path between two surfaces.

Examples of metal of the submicron wire can be nickel, gold, copper, or silver. Nickel, copper, and silver submicron wires were fabricated having room temperature thermal conductivity of 90.7, 401 and 429 $Wm^{-1}K^{-1}$ in their bulk form, respectively. Among them silver was the preferred metal of choice as bulk silver has the highest room temperature thermal conductivity of 429 $Wm^{-1}K^{-1}$. In the present invention a single submicron wire having high aspect ratio will be able to make a thermal path between the device and the heat sink without depending on any percolation and thereby eliminating the inter-particle thermal interface resistance as well found in the commercial TIM products.

The diameter of the metallic wires were kept at submicron level to conform the micron level roughness of the mating surfaces. However, the diameters were kept above 100 nm to minimize the defects (voids and dislocations in the metallic wires) and also to avoid electron and phonon scattering due to size effect of the wire's diameter, which in turn decrease the thermal diffusivity and conductivity of these wires. The length of these wires was 22 to 30 µm and thereby resulted in an aspect ratio of about 100 (when the length is 22 µm and the diameter is 220 nm). The reason behind choosing the 220-300 nm diameter is it is small enough to conform to the micron and submicron roughness whereas big enough to retain bulk thermal conductivity of metal. More generally the aspect ratio is in the range of 50 to 300.

The silver content of the full TIM is 23 wt % and can be increased by using a polymer template having larger diameter pores or by increasing the pore density. The pore density is $1\times10^8$ $cm^{-2}$, but could alternatively be in the range of $1\times10^8$ $cm^{-2}$ to $1\times10^{12}$ $cm^{-2}$. Increasing the porosity will result in larger metal/CNT content in the composite material. The widest useful Ag/CNT wt % range is 10% to 80%, however 20% to 50% is preferred, and 30% to 40% is most preferred. There is a trade-off between a desire to increase the Ag/CNT proportion but not so much that conformity of the TIM is reduced to the stage where thermal resilience at the contact surfaces is unduly increased.

The overall TIM thickness is c. 22 µm. In general, it is preferably in the range of 20 µm to 60 µm.

High aspect ratio continuous submicron wires are uniformly distributed in the composite material as shown in the schematic of FIG. 1. According to the rule of mixture for a simple parallel model, the effective thermal conductivity in the z direction is $$k_z = k_m(1-\phi) + k_p\phi \qquad 1)$$

where $k_z$ is the thermal conductivity of the composite material along z direction (i.e. perpendicular to the sample surface), $k_m$ and $k_p$ are the bulk thermal conductivities of matrix and submicron wires, $\phi$ is the percentage of wires in the composite. Using the effective medium theory the thermal conductivity of the composite can be calculated if volumetric heat capacity (product of density and specific heat capacity), wt % and thermal diffusivity (experimentally measured) of the constituent materials are known quantity. In order to compare the experimental diffusivity data directly with the above model, Equation (1) was re-configured to $$\alpha = \frac{k_{polycarbonate}(1-\phi) + k_{Ag}\phi}{(\rho c)_{polycarbonate}(1-\phi) + (\rho c)_{Ag}\phi} \qquad (2)$$

where k is the thermal conductivity and (pc) is heat capacity per unit volume for polycarbonate (or porous alumina) and Ag, and $\phi$ is the percentage of Ag (or other metal) in the composite. The wt % of silver was directly calculated using microbalance by measuring the samples before and after electrodeposition.

Figure 3:
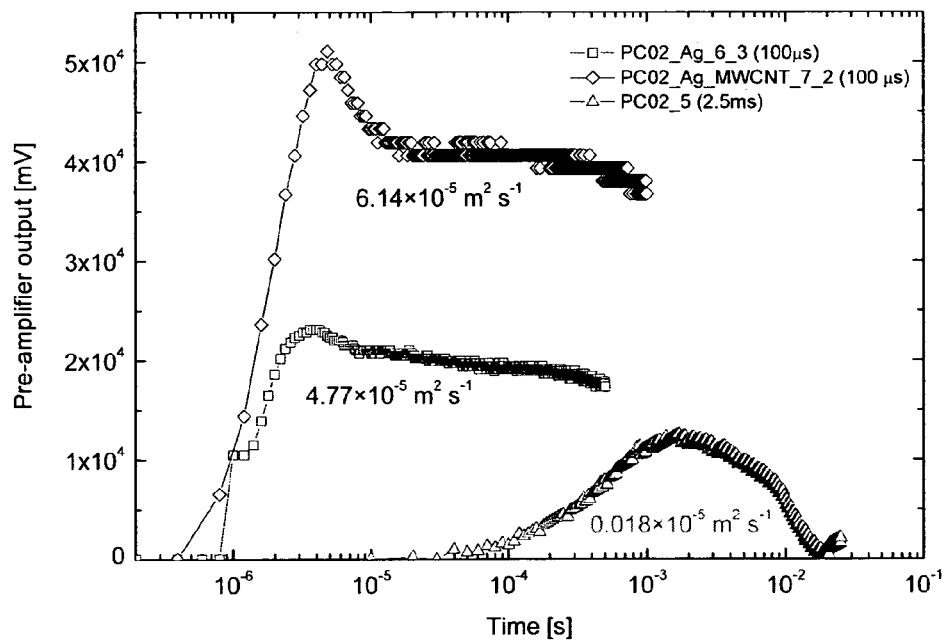
FIG. 3 is a set of plots illustrating enhancement of thermal diffusivity of a materials of the invention, the value 6.14× $10^{-5} m^2 s^{-1}$ being for the material of the invention, the value 4.77×$10^{-5} m^2 s^{-1}$ being for the polycarbonate template with only silver sub-micron wires, and the value 0.018×$10^{-5} m^2 s^{-1}$ being for the polycarbonate template only.
Figure 4:
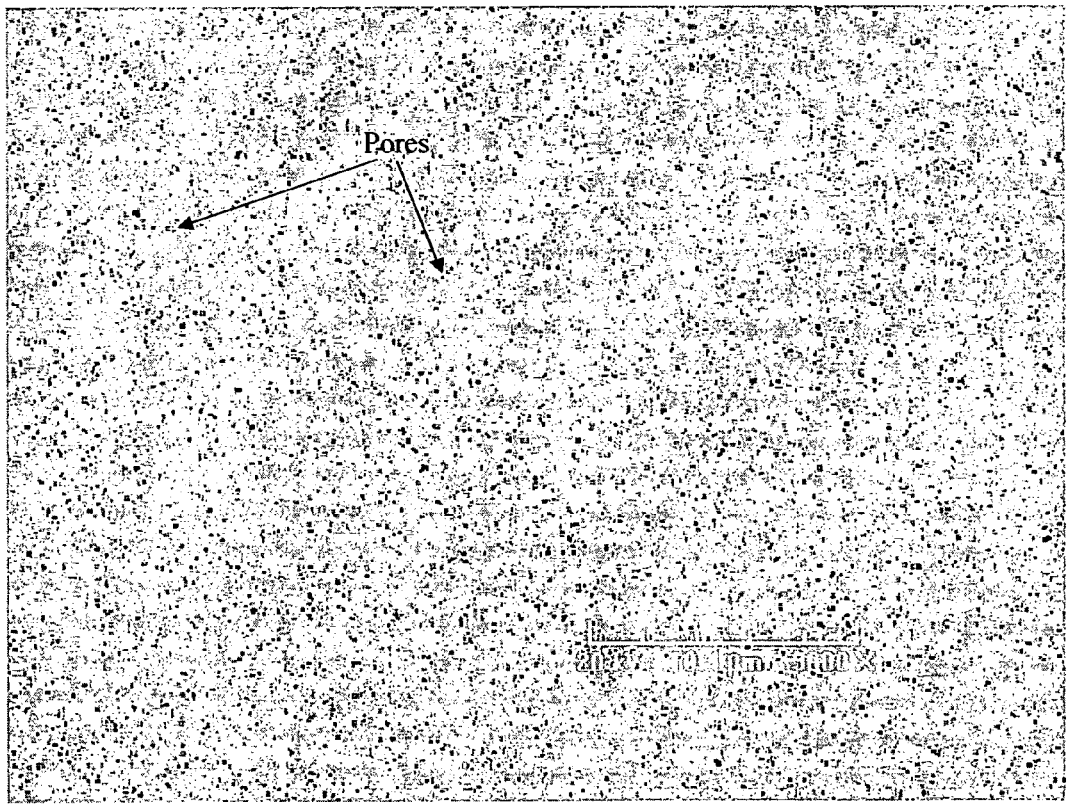
FIG. 4 is a scanning electron micrograph showing pores on the top surface of a polycarbonate template before processing.

Referring to FIG. 3 thermal conductivity data is summarised here as prototype test results of material. The prototype is a composite material of polycarbonate-silver wires (without CNT, Ag content is 23 wt %) and polycarbonate-silver-MWCNT material. The thermal conductivity of Ag/CNT wires showed a value of >360 $Wm^{-1}K^{-1}$ as calculated from the experimental thermal diffusivity measurements shown in FIG. 3. The overall TIM, including the polycarbonate template, showed a thermal conductivity greater than 100 $Wm^{-1}K^{-1}$ for an inclusion of 0.1-1 wt % of CNT inside the Ag submicron wires.

We have found that nanotube infused submicron metallic wires have at least 6 times higher thermal conductivity than present state of the art TIM (thermal interface material). Compared with current commercially available material it:
- has more than five times higher thermal conductivity across the thickness of the TIM than the present state of the art TIM films or pads polymer-metal/metal-oxide composites;
- has more than two times higher thermal conductivity than state of the art solder paste (e.g. pure In, In/Ag, Sn/Ag/Cu, In/Sn/Bi have bulk thermal conductivity of 30-50 $Wm^{-1}K^{-1}$ reported by Intel);
- is significantly lower cost than available solder based TIMs because a significant proportion of it is a polymer;
- is easier to apply, remove and clean;
- is stable up to 200° C. (higher is possible to achieve by adjustment of polymer selection); and
- has excellent contact surface conformity.

Manufacturing Method

Nuclear track etched Polycarbonate templates (Isopore™ 0.2 μm GTTP) were supplied by Millipore™.

Multiwalled Carbon nanotubes (Nanocyl®-3150) approximately 10 nm in diameter and 700 nm in length were supplied by Nanocyl™.

Polyacrylic acid was supplied by Sigma Aldrich™.

$AgNO_3$ and $H_3BO_3$ were supplied by Sigma Aldrich™.

A bath comprising 45 g $l^{-1}$ $AgNO_3$, 45 g $l^{-1}$ $H_3BO_3$, 0.1 g $l^{-1}$ of carbon nanotubes and 1 g $l^{-1}$ of polyacrylic acid was prepared and ultra sonicated for 30 minutes to achieve a homogeneous dispersion of nanotubes in the bath. The pH of the bath was adjusted to 2 by addition of $HNO_3$.

Electrodeposition of silver/multiwall carbon nanotubes composite was commenced using a two electrode cell with polycarbonate template as cathode and platinised titanium mesh as anode. The bath was operated at a current density of 2.5 mA $cm^{-2}$. The electrolyte temperature was maintained at 20±0.2° C. to prepare the samples using an ETS D-4 Fuzzy IKA WERKE temperature controller.

Figure 5:
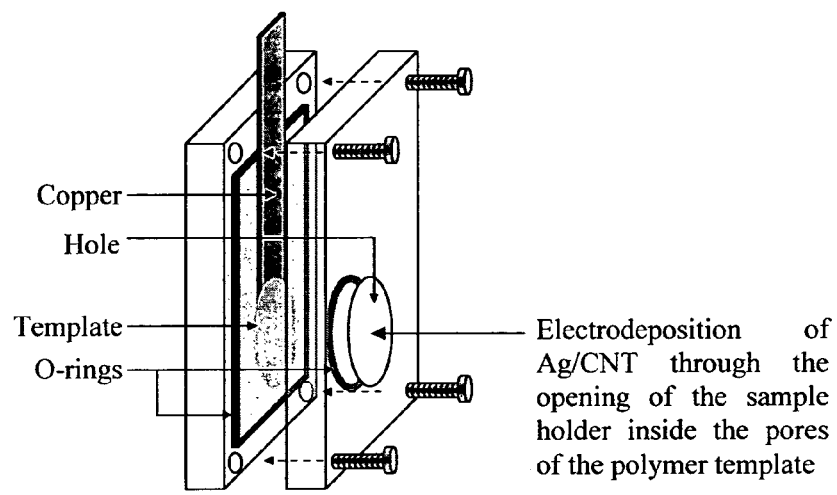
FIG. 5 is a schematic of an apparatus for electrodeposition of silver/carbon nanotube composites inside pores of polycarbonate template.

One side of the template was first deposited with 105 nm gold using evaporation method. A special sample holder was designed according to the schematic of FIG. 5 to mask the gold coated side of the polycarbonate template to ensure that the deposition will commence on Au at the base of the pores. The sample holder has two separate rectangular Teflon blocks. One of them has circular opening which has a diameter of 10 mm. In the inner side of that block a circular o-ring was placed in groove in order to stop electrolyte going on the back side (Au coated side) of the template. Before deposition, template is placed on top of the o-ring in such a way that Au coated side is opposite to the o-ring. Then a strip of Cu was placed on the Au coated side according to FIG. 5. The other block which also has a rectangular o-ring surrounding the edge of the block then placed on top of the Cu strip. Both the blocks are then screwed together to achieve a sealed environment inside so that electrolyte cannot pass through rather than flowing through the front opening and then start depositing on Au at the bottom of the pores.

Figure 6:
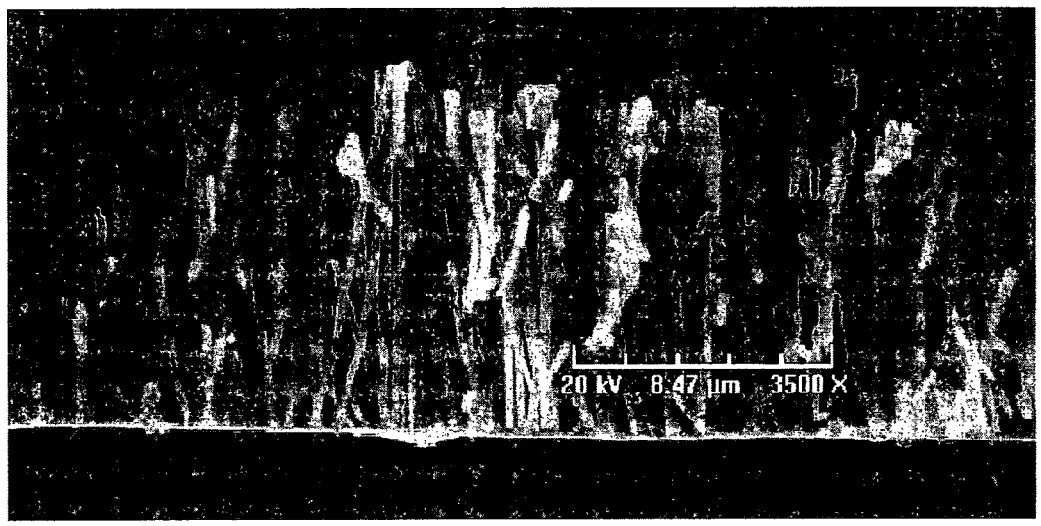
FIG. 6 is a cross section of the thermal interface material ("TIM")

The silver carbon nanotube composites deposited as submicron wires according to the structures of the pores of the template and have a length of 30±5 μm as was measured using SEM. FIG. 6 shows the cross section of polymer membrane after electrodeposition of Ag/CNT where the submicron wires are clearly visible. The concentration of CNT in the wires by weight was c. 0.1 to 1%.

Reliability of the Ag-MWCNT-Polymer Composite Film

Figure 7:
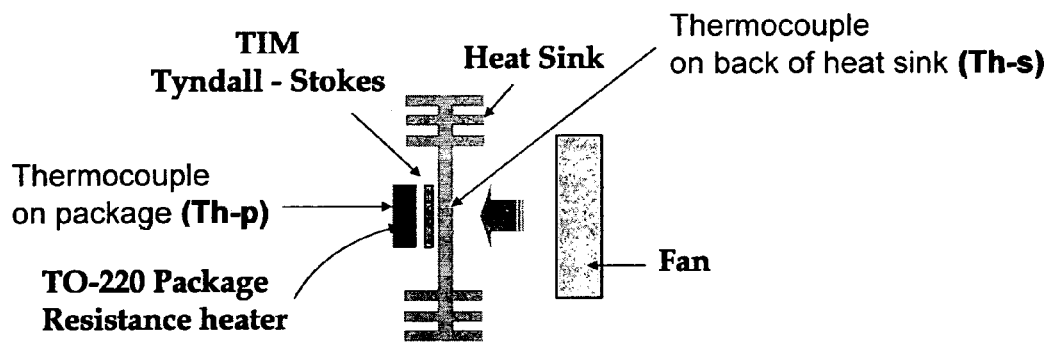
FIG. 7 is a test setup to investigate the reliability of the TIM.
Figure 8:
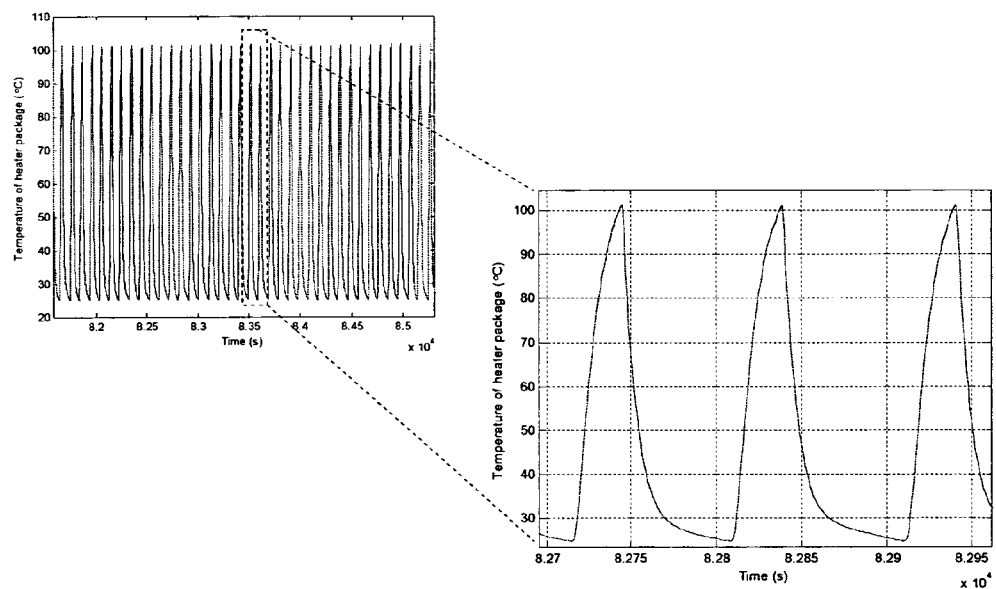
FIG. 8 is a plot showing a thermal profile.

In order to investigate the reliability of the Ag-MWCNT polymer nanocomposite films as thermal interface material a test setup was developed according to the schematic of FIG. 7. Thermocouples were placed on the heater and the reverse of heat sink, this data was logged using a 24-bit NI USB-9211 DAQ. Power to the heater was supplied using a standard PSU via a relay switch, which was controlled by a LABview program (8.0). When the thermocouple on the heater reached 100° C. (Th-p), temperature was measured using the thermocouple on back of the heat sink (Th-s). Then the heater current was turned off, and the fan switched on. This was reversed when the package thermocouple reached 25° C. Recorded thermal profile (Th-p) was shown in FIG. 8.

Figure 9:
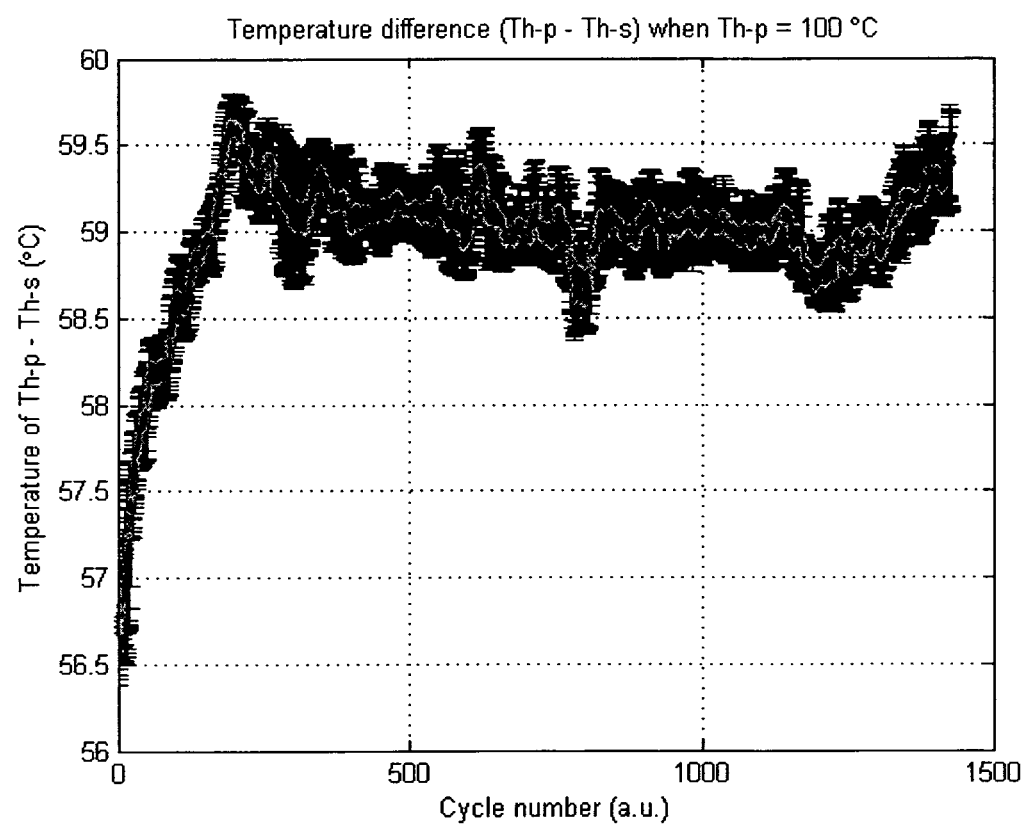
FIG. 9 is a plot showing thermal difference between the packaged resistance heater (Th-p) and the back of heat sink (Th-s) when heater (Th-p) is at 100° C., showing that after the first c. 200 cycles the excellent reliability.

FIG. 9 shows the thermal difference between (Th-p) and (Th-s) when (Th-p) is at 100° C. In the first 200 cycles the temperature difference increased from 56.5° C. to 59.5° C., resulted a difference of 3° C. After 200 cycles this difference stabilizes to a variation of 1° C. These results showed that the thermal performance of the TIM is constant for at least 1400 power cycles. This is evident that the thermal performance of the TIM is constant for at least 1400 power cycles.

The invention is not limited to the embodiments described but may be varied in construction and detail. For example the CNTs may be of boron nitride nanotubes. In this case the TIM would have the benefit of being less electrically conducting. Also, the TIM of the invention need not necessarily have nanotubes in the wires—significant thermal conductivity being achieved with metal-only submicron wires.

The invention claimed is:

1. A thermal interface material comprising:
a body having opposed faces, and submicron diameter wires aligned with respect to each other in pores in the body and the pores extending between the opposed faces, each submicron diameter wire including a metal, wherein the wires include nano-scale carbon particles aligned in the metal, the carbon particles have a diameter of approximately 9.5 nm to 10 nm, and wherein the wire diameter is approximately 200 to 220 nm.

2. A thermal interface material as claimed in claim 1, wherein the carbon particles are carbon nanotubes.

3. A thermal interface material as claimed in claim 1, wherein the carbon particles are of a type selected from carbon nanohorns, fullerenes, or nanofibres.

4. A thermal interface material as claimed in claim 1, wherein the metal is silver.

5. A thermal interface material as claimed in claim 1, wherein the wires include nanotubes of boron nitride.

6. A thermal interface material as claimed in claim 1, wherein proportion by weight of wires to polymer body is in the range of 20% to 50%.

7. A thermal interface material as claimed in claim 1, wherein the pore density of the body is in the range of $1 \times 10^8$ $cm^{-2}$ to $1 \times 10^{12}$ $cm^{-2}$.

8. A thermal interface material as claimed in claim 1, wherein the length of the wires is in the range of 10 μm to 60 μm.

9. A thermal interface material as claimed in claim 1, wherein the aspect ratio of the wires is in the range of 50 to 300.

10. A thermal interface material as claimed in claim 1, wherein the body is a polymer.

11. A method of producing a thermal interface material of claim 1, wherein the metal is deposited in an electro-deposition process in the pores of the body to form the aligned sub-micron wires.

12. A method as claimed in claim 11, wherein the metal is co-deposited with dispersed carbon particles in a bath in the electro-deposition process in the pores of the body, so that the carbon particles are aligned and embedded in the metal.

13. A method as claimed in claim 11, wherein the pores are of generally cylindrical configuration.

\* \* \* \* \*